(12) United States Patent
Streit

(10) Patent No.: US 7,072,925 B2
(45) Date of Patent: Jul. 4, 2006

(54) GENERATOR STRUCTURES AND METHODS THAT PROVIDE LOW-HARMONIC CURVILINEAR WAVEFORMS

(75) Inventor: Lawrence C. Streit, Fishers, IN (US)

(73) Assignee: Analog Devices, Inc., Norwood, MA (US)

( * ) Notice: Subject to any disclaimer, the term of this patent is extended or adjusted under 35 U.S.C. 154(b) by 639 days.

(21) Appl. No.: 10/349,373

(22) Filed: Jan. 21, 2003

(65) Prior Publication Data

US 2004/0160248 A1    Aug. 19, 2004

(51) Int. Cl.
*G06F 1/02*    (2006.01)
(52) U.S. Cl. ...................................... 708/276
(58) Field of Classification Search ................. 708/276
See application file for complete search history.

(56) References Cited

U.S. PATENT DOCUMENTS

| | | | |
|---|---|---|---|
| 4,599,703 A | 7/1986 | Bilharz | 364/851 |
| 4,620,314 A * | 10/1986 | Jansen et al. | 381/4 |
| 5,132,636 A | 7/1992 | Hori | 328/22 |
| 5,412,338 A * | 5/1995 | Richards et al. | 327/107 |
| 5,737,253 A | 4/1998 | Madisetti et al. | |
| 5,799,265 A | 8/1998 | He | |
| 6,347,325 B1 | 2/2002 | Ribner et al. | |
| 6,373,316 B1 * | 4/2002 | Wu | 327/356 |
| 6,400,821 B1 | 6/2002 | Burgan et al. | |
| 6,446,244 B1 | 9/2002 | Huber | 716/8 |
| 2002/0184274 A1 * | 12/2002 | Shipley | 708/276 |

OTHER PUBLICATIONS

"Sine Wave Generation Techniques", National Semiconductor Application Note AN 263, Mar. 1981, National Semiconductor, Arlington, Texas.
"Versatile Waveform Generator", Maxim Application Note, Maxim Integrated Products, Mar. 13, 2000, Sunnyvale, California.

* cited by examiner

*Primary Examiner*—David H. Malzahn
(74) *Attorney, Agent, or Firm*—Koppel, Patrick & Heybl

(57) ABSTRACT

Simple, inexpensive waveform generators and methods are provided that generate curvilinear waveforms which comprise a fundamental sinusoid and harmonics that are either absent or are significantly reduced from the fundamental. In an exemplary method, a generator converts a first straight-line waveform into a level-shifted, frequency-doubled second straight-line waveform, multiplies the straight-line segments of the first and second waveforms to provide a first curvilinear waveform, and sums this curvilinear waveform with a scaled version of the first straight-line waveform to realize a second curvilinear waveform with further-reduced harmonics.

46 Claims, 8 Drawing Sheets

GENERATOR STRUCTURES AND METHODS THAT PROVIDE LOW-HARMONIC CURVILINEAR WAVEFORMS

BACKGROUND OF THE INVENTION

1. Field of the Invention

The present invention relates generally to waveform generators.

2. Description of the Related Art

The generation of sinusoidal waveforms (i.e., sine and cosine signals) is a fundamental process in an enormous array of electronic systems (e.g., communication systems, display systems, and radar systems). Accordingly, a substantial number of sinusoidal generators have been developed such as traditional feedback oscillators that realize sinusoidal waveforms with the aid of feedback structures (e.g., RC phase-shift networks, LC resonant circuits, tuning forks and crystals).

Although feedback oscillators can generate low-harmonic, highly-stable sinusoidal signals, they generally fail to provide the wide tuning range that is obtained, for example, by generators that use triangle-driven signal shapers. An exemplary one of these generators provides a triangle waveform (e.g., with a digital-to-analog converter (DAC)) and utilizes the nonlinear logarithmic relationship between base-emitter voltage $V_{be}$ and collector current $I_c$ as a logarithmic shaper to smooth the triangle waveform into a corresponding sinusoidal waveform.

Another exemplary wide-range generator shapes a triangle waveform with a breakpoint shaper that sequentially turns on and off an array of diodes that selectively couple a corresponding array of resistors into the waveform's path.

Digital processes are used to realize other wide-range waveform generators. For example, a phase accumulator (or an up/down counter) provides a first stream of successive binary words that are spaced by a designated phase step. The first stream can be passed through a lookup table which converts the first stream into a second stream that defines a sinusoidal waveform.

The actual waveform is then generated by a DAC which receives the second stream of digital words. Alternatively, the first stream of digital words can be passed directly to a DAC to provide a triangle waveform which is then shaped by wave shapers (e.g., as described above) into sinusoidal waveforms.

In another type of digital waveform generator, a CORDIC algorithm is processed to determine (e.g., in a microprocessor) sine and cosine values of selected angles as the coordinates along x and y axes of a successively rotated phasor.

Although various structures and methods thus exist for wide-range generation of sinusoidal waveforms, they typically include requirements (e.g., signal shapers require closely-controlled amplitudes, lookup tables require large portions of chip area and algorithms generally require significant calculation time) that are not compatible with simple, low-cost, wide-range generation of sinusoidal waveforms.

BRIEF SUMMARY OF THE INVENTION

The present invention is directed to simple, inexpensive generator structures and methods that provide wide-range, low-harmonic curvilinear waveforms. The methods generally begin with a step of providing first and second waveforms that respectively comprise first and second straight-line segments and a subsequent step of multiplying the first and second straight-line segments to thereby generate a curvilinear waveform.

The novel features of the invention are set forth with particularity in the appended claims. The invention will be best understood from the following description when read in conjunction with the accompanying drawings.

DETAILED DESCRIPTION OF THE INVENTION

Although the generation of sinusoidal waveforms is a fundamental and useful process in electronic systems, the waveforms are seldom perfect sinusoids but, rather, they typically comprise a fundamental sinusoid and harmonics of the fundamental. In the present invention, such waveforms are, for clarity, referred to as curvilinear waveforms which comprise a fundamental sinusoid and harmonics that are reduced from the fundamental. It is noted that the invention provides curvilinear waveforms in which the reduction is sufficient for many uses but also provides other curvilinear waveforms that have greater reduction for other more-demanding applications.

Figure 1:
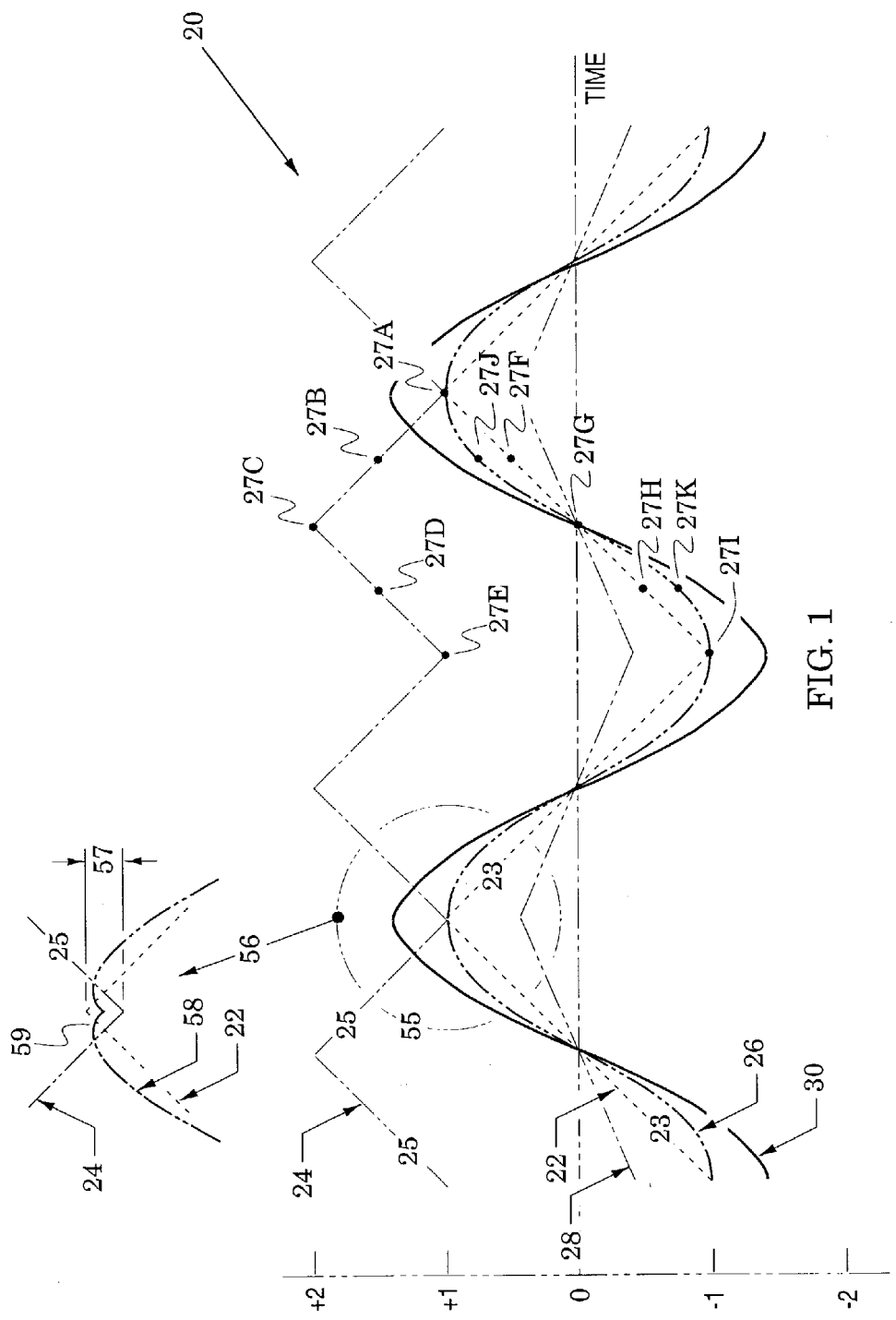
FIGS. 1–5 are graphs that illustrates method embodiments of the present invention for generating curvilinear waveforms.

The graph 20 of FIG. 1, for example, illustrates one embodiment of the invention which provides a first waveform 22 that comprises first straight-line segments 23 and a second waveform 24 that comprises second straight-line segments 25. In a process of the invention, the first and second straight-line segments 23 and 25 are multiplied together to thereby generate a first curvilinear waveform 26 (this multiplication process is exemplified by multiplying exemplary points 27A, 27B, 27C, 27D and 27E that lie on the second waveform 24 by exemplary points 27A, 27F, 27G, 27H and 27I that lie on the first waveform to thereby realize exemplary points 27A, 27J, 27G, 27K and 27I on the first curvilinear waveform 26).

In an embodiment of the invention, the second waveform 24 has a second frequency that is substantially twice the first frequency of the first waveform 22. This relationship may be obtained in one process by frequency multiplying the first waveform to obtain the second waveform and, in another process, by frequency dividing the second waveform to obtain the first waveform. In yet another process of the invention, the frequency multiplying may be realized by full-wave rectifying the first waveform. This process causes the second waveform to have a second amplitude that is one half the first amplitude of the first waveform as shown in FIG. 1.

In the method illustrated in FIG. 1, the second waveform is level offset to position lower extremities of the second waveform substantially contiguous with upper extremities of the first waveform prior to the multiplying step that multiplies the first and second straight-line segments 23 and 25.

The first curvilinear waveform 26 is thus obtained by multiplying the first straight-line segments 23 of the first waveform 22 by the second straight-line segments 25 of the second waveform 24 wherein the second waveform is frequency-doubled relative to the first waveform 22 and level offset to position its lower extremities substantially contiguous with upper extremities of the first waveform 22.

Another process of FIG. 1 adds a third waveform to the first curvilinear waveform to thereby generate a second curvilinear waveform that has a greater reduction of harmonics. In particular, a first process scales the first waveform 22 to obtain a first scaled waveform 28 which is then added to the first curvilinear waveform 26 to generate the second curvilinear waveform 30 which has harmonics that are further reduced than those of the first curvilinear waveform.

It is noted that both the first and second curvilinear waveforms have an absence of even harmonics (e.g., an absence of a second harmonic). In an exemplary method embodiment in which the first scaled waveform 28 has been scaled by a scale factor of substantially 3/7, it has been found that the third harmonic of the second curvilinear waveform is reduced to greater than 71 dB below the fundamental, the fifth harmonic is reduced to greater than 35 dB and all of the other odd harmonics are reduced greater than 50 dB. Other useful scale factors generally lie between 2/7 and 4/7 but could range between 0 and 1.

As described above, the first and second waveforms 22 and 24 of FIG. 1 respectively comprise first and second straight-line segments 23 and 25. Therefore, they are straight-lined waveforms and, in particular, they are a type of straight-lined waveform that is generally referred to as a triangle waveform. The generator structures and methods of the invention also generate curvilinear waveforms from other straight-lined waveforms such as the seventh and eighth waveforms 91 and 95 of FIG. 5 which are a type of straight-lined waveform that is generally referred to as a sawtooth waveform.

Figure 2:
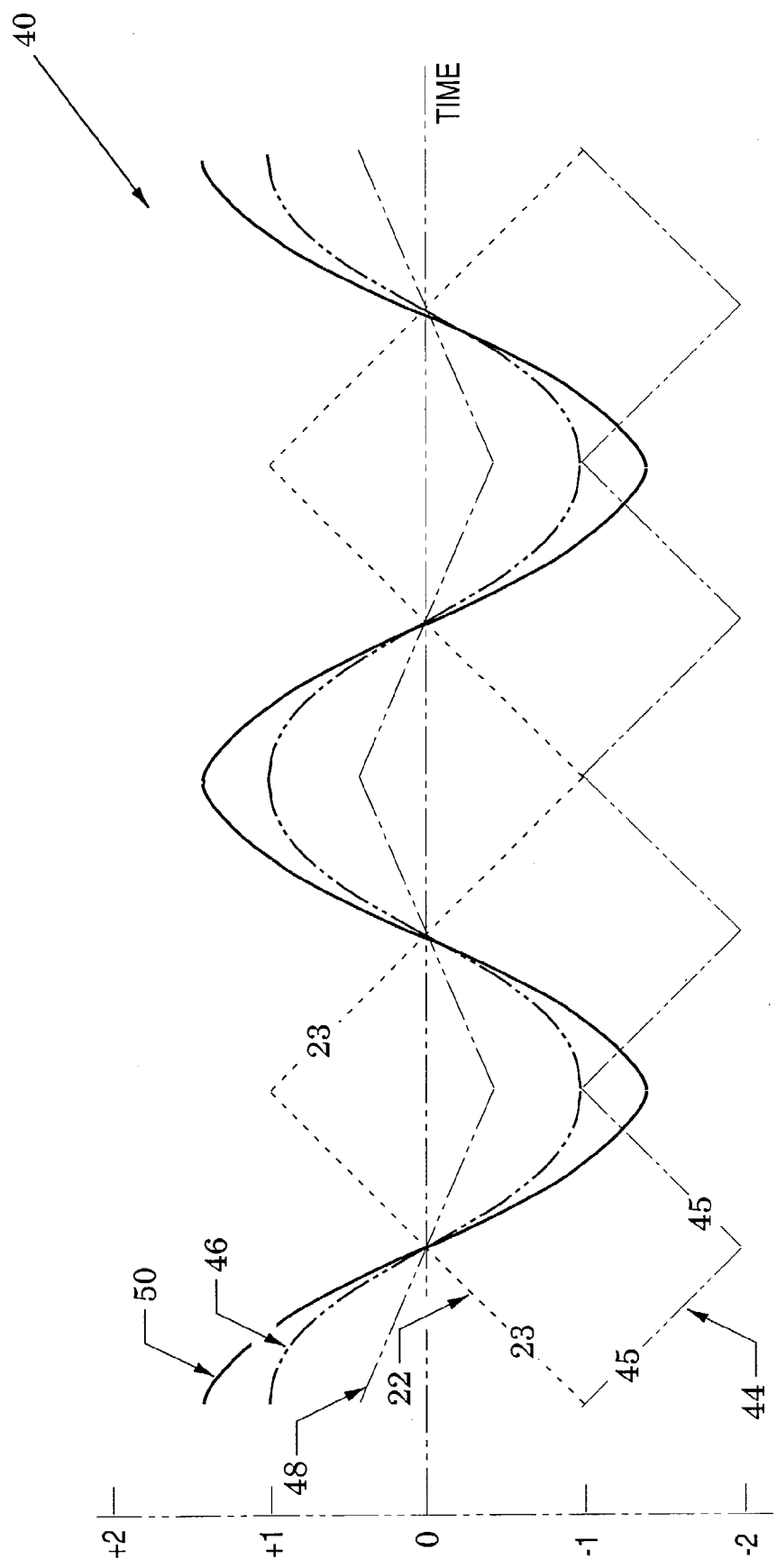

Further method embodiments of the invention are shown in the graph 40 of FIG. 2 which includes the first waveform 22 of FIG. 1 with its first straight-line segments 23. Similar to the processes of FIG. 1, a third waveform 44 is provided with a third frequency that is substantially twice the first frequency of the first waveform 22 and a third amplitude that is one half the first amplitude of the first waveform. In contrast, however, the third waveform is level offset to position its upper extremities substantially contiguous with lower extremities of the first waveform 22.

The third straight-line segments 45 of the third waveform 44 are then multiplied by the first straight-line segments 23 of the first waveform 22 to obtain a third curvilinear waveform 46 which is the inverse of the first curvilinear waveform (26 in FIG. 1).

In other processes of FIG. 2, the first waveform 22 is inverted and scaled by a scale factor of substantially 3/7 to obtain a second scaled waveform 48 which is then added to the third curvilinear waveform 46 to generate a fourth curvilinear waveform 50 which has harmonics that are further reduced than those of the third curvilinear waveform 46. It is noted that the fourth curvilinear waveform 50 is the inverse of the second curvilinear waveform (30 in FIG. 1).

Returning attention to FIG. 1, a waveform area 55 is repeated as indicated by repetition arrow 56 to show, in another process of the invention, that the second waveform 24 can be level shifted to space its lower extremities from upper extremities of the first waveform 22 by a separation space 57 that is preferably less than one half of the least of the first and second amplitudes of the first and second waveforms.

As shown in FIG. 1, this causes the second curvilinear waveform 26 which is the product of the first and second straight-line segments 23 and 25 to be modified to a fifth curvilinear waveform 58 that has reversed (i.e., "dished-in") peaks 59. Although its harmonics are less reduced than those of the second curvilinear waveform 26, the fifth curvilinear waveform 58 is also useful in various applications (e.g., in motor control).

Figure 3:
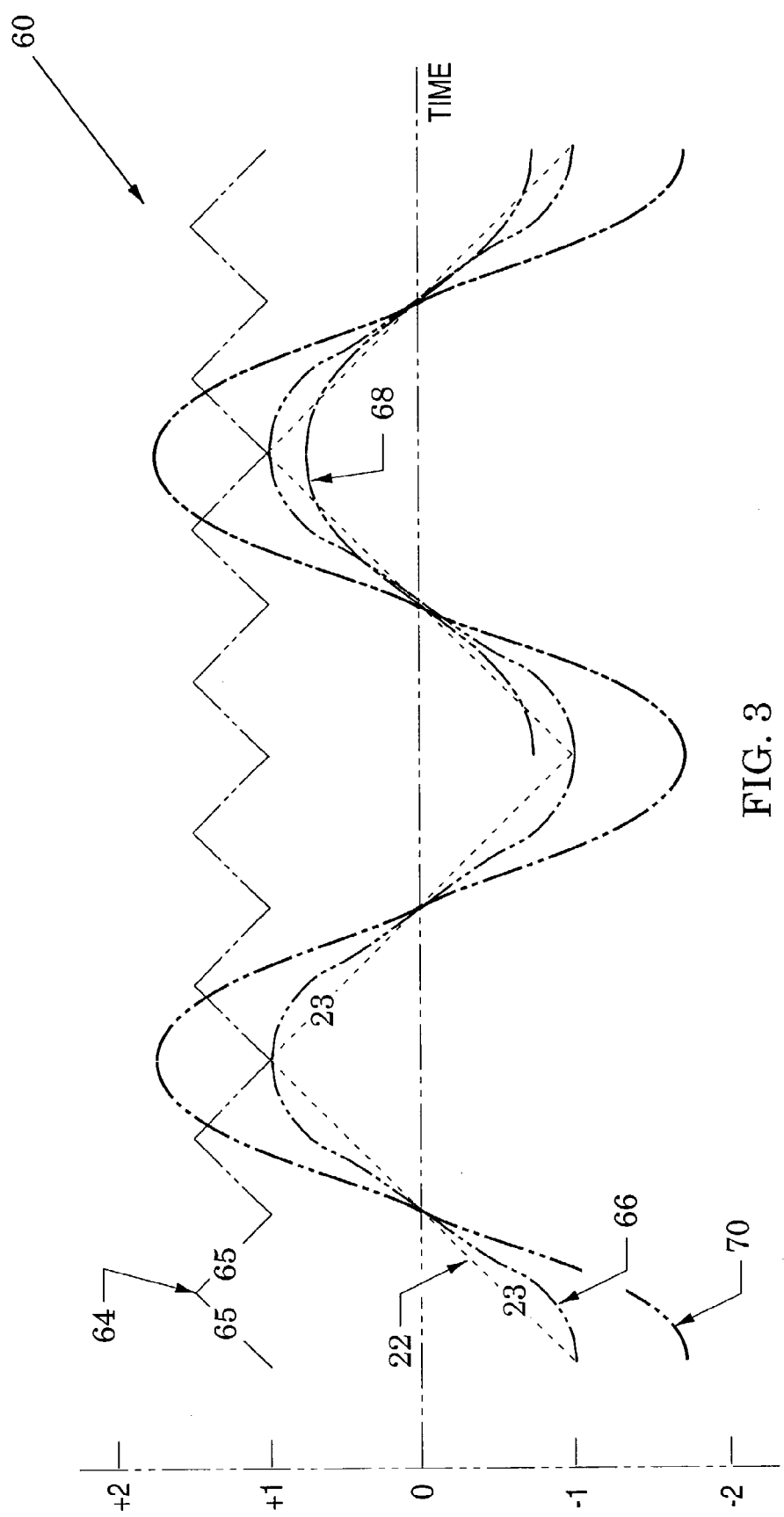

The graph 60 of FIG. 3 illustrates another method embodiment of the invention in which the first waveform 22 with its first straight-line segments 23 is multiplied by a fourth waveform 64 with fourth straight-line segments 65 to form a sixth curvilinear waveform 66. The fourth waveform has a fourth frequency that is substantially four times the first frequency of the first waveform and has a fourth amplitude that is substantially one fourth of the first amplitude of the first waveform. In a process embodiment, the fourth waveform 62 is level shifted, prior to the multiplying step, to position its lower extremities substantially contiguous with upper extremities of the first waveform 22.

Similar to the first curvilinear waveform 26 of FIG. 1, the sixth curvilinear waveform 66 has an absence of even harmonics and has odd harmonics which are reduced from its fundamental sinusoid. In the processes of FIG. 1, the first scaled waveform 28 was added to the first curvilinear waveform 26 to generate the second curvilinear waveform 30 which has harmonics that are further reduced.

In contrast to those processes, FIG. 3 exemplifies a process in which curvilinear waveforms are added to generate another curvilinear waveform in which the harmonics are further reduced. Preferably, this process is preceded by scaling the amplitude of one of the curvilinear waveforms prior to the adding process. In the exemplary embodiment shown in FIG. 3, the first curvilinear waveform (26 in FIG. 1) is scaled by a scale factor of 0.75 to form a reduced first curvilinear waveform 68 (only one period of the reduced first curvilinear waveform 68 is shown in FIG. 3 to avoid confusion which would otherwise degrade the graph's clarity) which is then added to the sixth curvilinear waveform 66 to generate a seventh curvilinear waveform 70 which has harmonics that are reduced from those of the second and fifth curvilinear waveforms.

Figure 4:
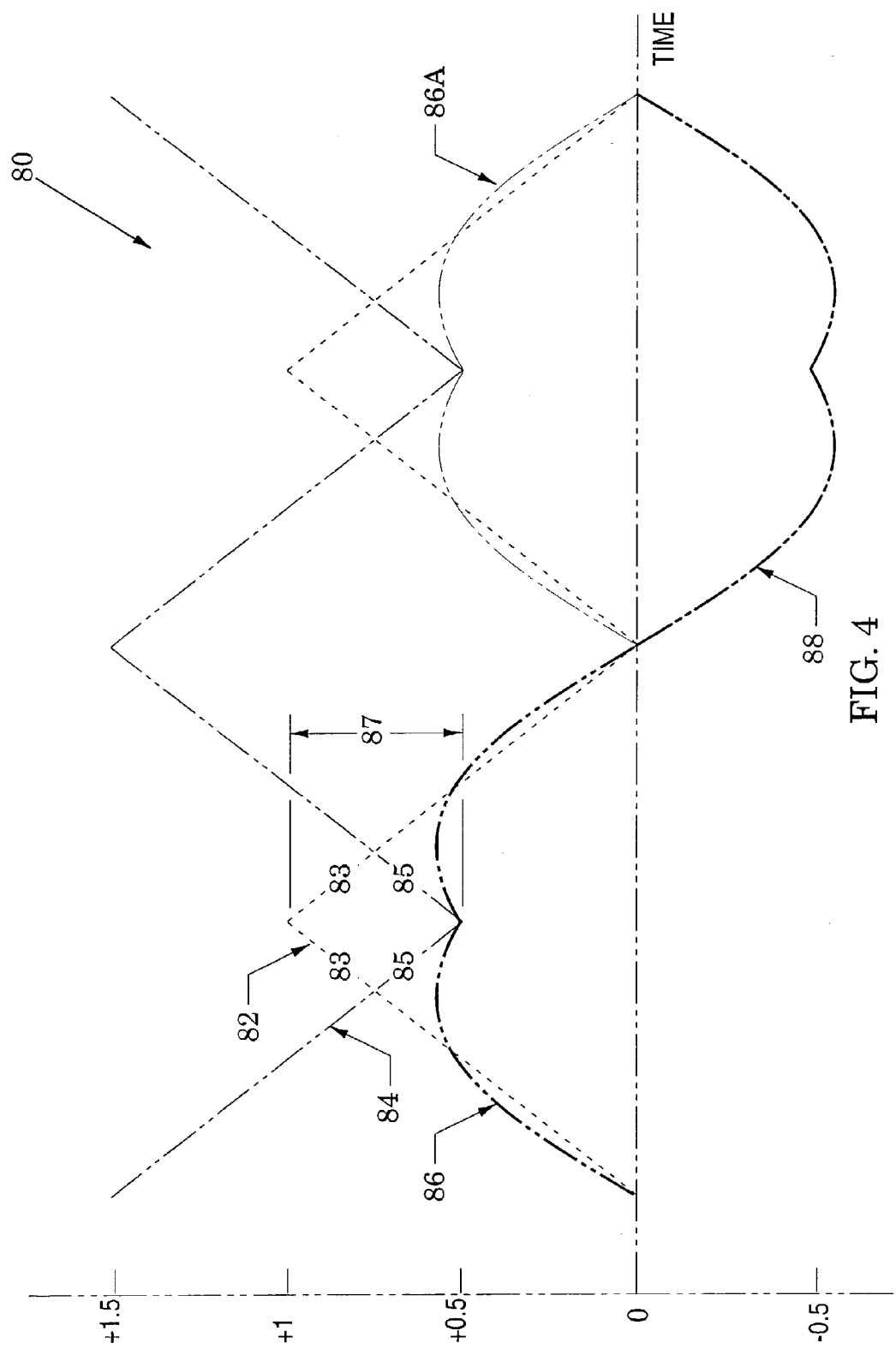

The graph 80 of FIG. 4 illustrates yet another method embodiment of the invention in which a fifth waveform 82 with fifth straight-line segments 83 is multiplied by a sixth waveform 84 with sixth straight-line segments 85 wherein the fifth and sixth waveforms have the same frequencies and the same amplitudes but the sixth waveform has been level shifted to space its lower extremities from upper extremities of the fifth waveform by a separation space 87 that is preferably less than one half of their common amplitudes.

The product of the fifth and sixth waveforms forms an asymmetrical curvilinear waveform 86 in each of successive periods (for clarity of illustration, the asymmetrical curvilinear waveform is shown in light lines in a second period 86A) that has an absence of odd harmonics and has even harmonics that are reduced from its fundamental sinusoid. In another process of the invention, the asymmetrical curvilinear waveform 86 is then inverted in alternate periods to thereby generate a symmetrical curvilinear waveform 88 that has an absence of even harmonics and has odd harmonics that are reduced from a fundamental sinusoid. It is observed that the symmetrical curvilinear waveform 88 has portions similar to the reversed peaks (59 in FIG. 1) of the fifth cuvilinear waveform (58 in FIG. 1).

Figure 5:
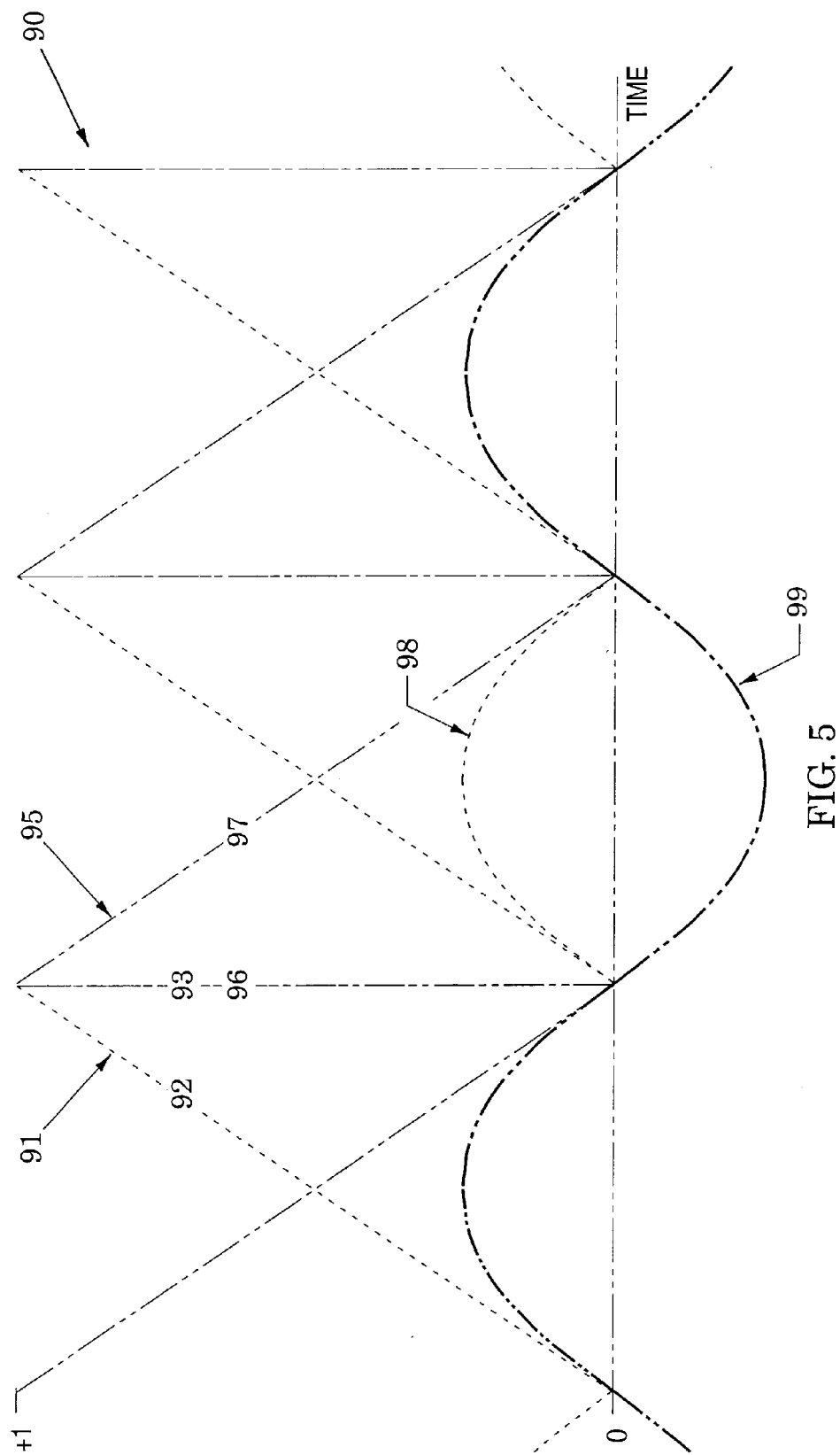

The graph 90 of FIG. 5 illustrates yet another method embodiment of the invention in which a seventh waveform 91 (which is a sawtooth waveform) with seventh straight-line segments 92 and 93 is multiplied by an eight waveform 95 (also a sawtooth waveform) with eighth straight-line segments 96 and 97 to form an asymmetrical curvilinear waveform 98. Alternate cycles of the asymmetrical curvilinear waveform 98 can then be inverted to provide the symmetrical curvilinear waveform 99 which is similar to the first curvilinear waveform 26 of FIG. 1.

In FIG. 5, the vertical straight-line segments 93 and 96 are coincident and every other cycle of the asymmetrical curvilinear waveform 98 is coincident with corresponding cycles of the symmetrical curvilinear waveform 99. It is noted that the eight waveform 95 can be obtained by inverting the seventh waveform 91.

Attention is now directed to at least a partial summary of the methods of FIGS. 1–5 for generating curvilinear waveforms that each comprise a fundamental sinusoid and harmonics that are substantially reduced from the sinusoid. Initially, first and second triangle waveforms are provided that respectively comprise first and second straight-line segments and the first and second straight-line segments are multiplied to thereby generate a first curvilinear waveform.

Although the first and second triangle waveforms can have the same frequency, the second triangle waveform may also have a second frequency which is preferably an integer multiple (e.g., 1, 2 or 4) of the first frequency. Although the first and second triangle waveforms can have the same amplitude, the second triangle waveform may also have a second amplitude that is less than the first amplitude (e.g., substantially one half or one fourth of the first amplitude).

One of the first and second triangle waveforms can be level shifted prior to the multiplying step to position its lower extremities substantially contiguous with upper extremities of the other of the first and second triangle waveforms. Alternatively, one of the first and second triangle waveforms can be level shifted prior to the multiplying step to space its lower extremities from upper extremities of the other by a separation space that is less than one half of the least of the first and second amplitudes.

It was noted in FIGS. 1–5 that one of the first and second triangle waveforms can be frequency multiplied (e.g., by full-wave rectifying) to thereby generate the other of the first and second triangle waveforms. It was further noted that one of the first and second triangle waveforms can be frequency divided to thereby generate the other of the first and second triangle waveforms.

It was also disclosed that one of the curvilinear waveforms may define an asymmetrical curvilinear waveform in each of successive periods and that such an asymmetrical waveform may be inverted in alternate periods to thereby generate a symmetrical curvilinear waveform.

It was further disclosed that a third triangle waveform may be added to a first curvilinear waveform to thereby generate a second curvilinear waveform and that one of the first and second triangle waveforms can be scaled to provide the third triangle waveform.

The process described above to form a second curvilinear waveform can be repeated with different scale factors and with different waveform frequencies to form a third curvilinear waveform and that the second and third curvilinear waveforms (or scaled versions of these waveforms) may be added to form yet another curvilinear waveform.

Figure 6:
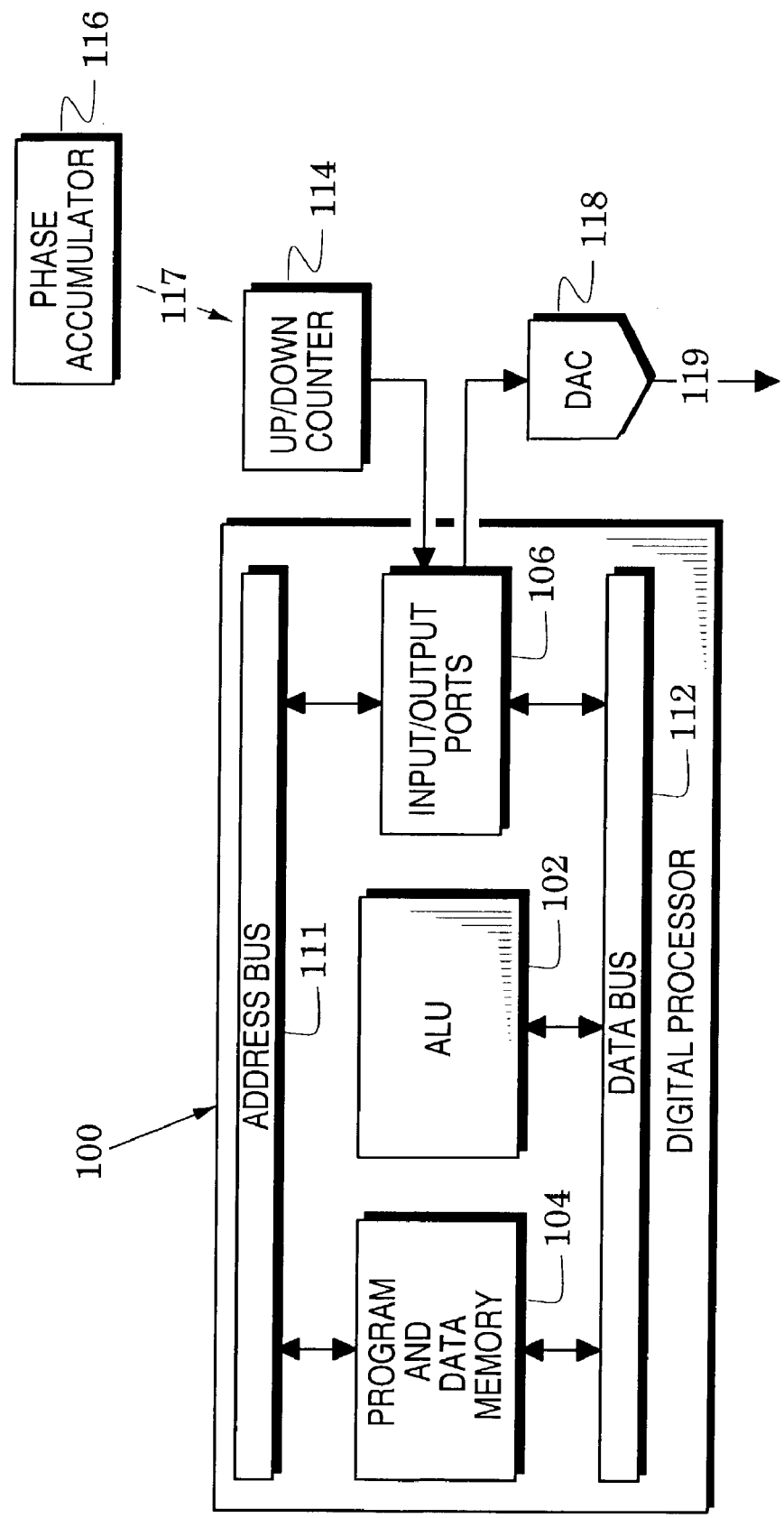
FIG. 6 is a block diagram of a digital processor for practicing the methods of FIGS. 1–5.

The methods of the invention may be practiced with digital processors (e.g., microcontrollers, microprocessors and digital signal processors) as exemplified by the processor 100 of FIG. 6. The processor includes an arithmetic logic unit (ALU) 102, a program and data memory 104 and input/output ports 106 that are coupled between at least one address bus 111 and at least one data bus 112. The memory 104 thus forms a program storage device which has instructions that are readable and executable by the processor and that define the methods of the invention illustrated in FIGS. 1–5 for generating curvilinear waveforms.

Digital representations of straight-line waveforms can be provided to the input/output ports 106 from various sources, e.g., an up/down converter 114. Alternatively, a phase accumulator 116 can be substituted for the up/down converter as indicated by substitution arrow 117. The associated lookup table may be included in the memory 106. A digital-to-analog converter 118 can be coupled to the input/output ports 106 to convert the digital representations to analog versions 119 of the curvilinear waveforms. In other embodiments of the invention, the up/down converter 114, the phase accumulator 116 and the digital-to-analog converter 118 can be realized by the processor 100.

The methods of the invention may also be practiced with conventional waveform processing elements (e.g., multipliers, adders, frequency multipliers, level shifters, scalers and inverters) that are commonly formed of analog devices (e.g., differential amplifiers) and/or logic gates (e.g., AND, OR, EXCLUSIVE OR (XOR) and EXCLUSIVE NOR (XNOR) gates) but which are specifically arranged to realize the methods.

Figure 7:
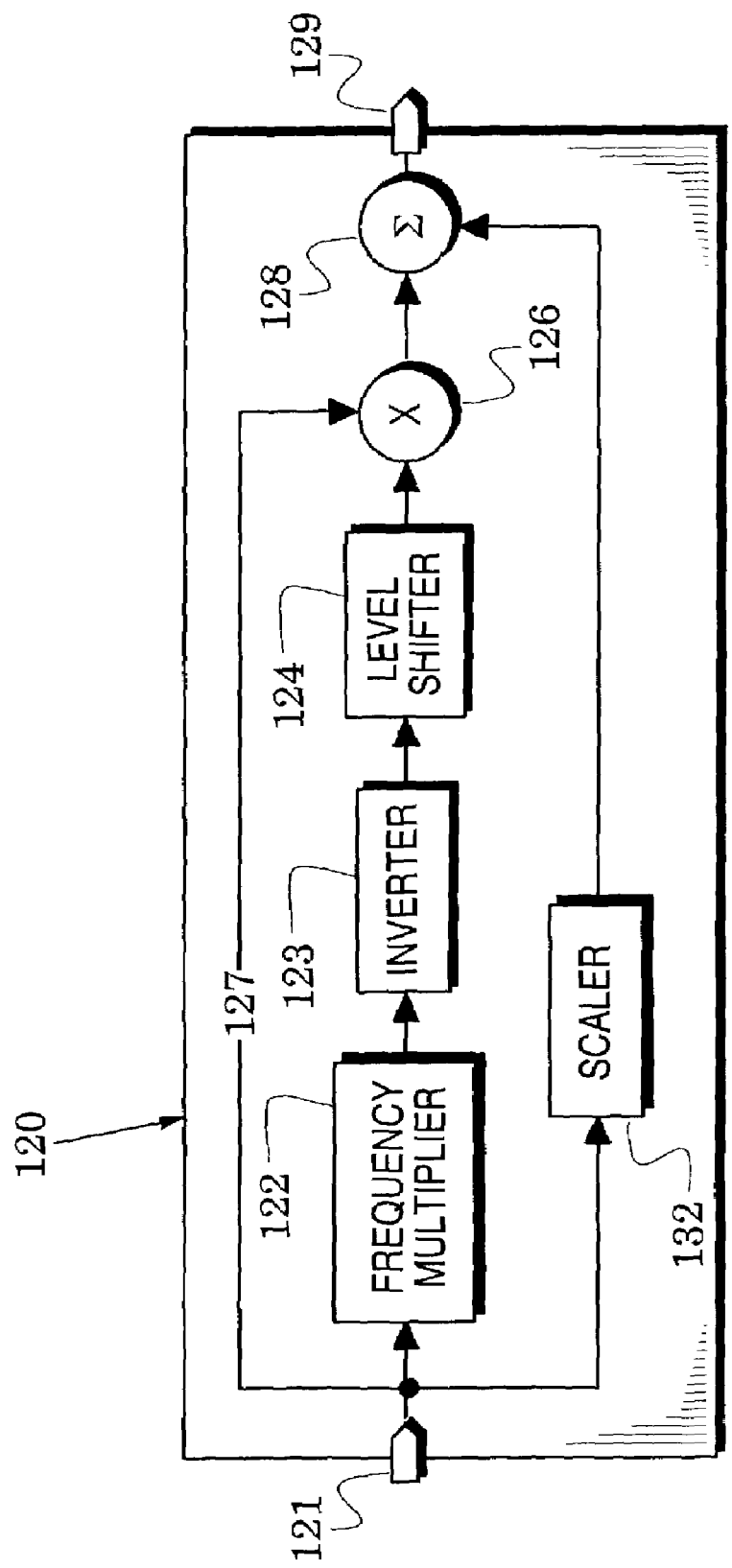
FIGS. 7 and 8 are block diagrams of waveform generators for practicing the methods of FIGS. 1–5.

FIG. 7, for example, illustrates a waveform generator 120 that processes a series combination of a frequency multiplier 122, an inverter 123, a level shifter 124, a multiplier 126 and an adder 128 coupled between a generator input port 121 and a generator output port 129. The input port is also coupled by a signal path 127 to a second input of the multiplier 126 and is further coupled to a second input of the adder 128 by a scaler 132.

In an exemplary operation of the waveform generator 120, a first straight-line waveform (22 of FIG. 1) is received at the input port and is full-wave rectified by the frequency multiplier 122. The resultant waveform is inverted by the inverter 123 and level shifted by the level shifter 124 to form a second straight-line waveform (24 in FIG. 1) whose lower extremities are substantially contiguous with upper extremities of the first straight-line waveform.

The first straight-line waveform is provided along signal path 127 to be multiplied by the second straight-line waveform in the multiplier 126 to thereby form the first curvilinear waveform (26 in FIG. 1). The scaler 132 scales the first straight-line waveform to provide the scaled straight-line waveform (28 in FIG. 1) which is added to the first curvilinear waveform in the adder 128 to generate the second cuvilinear waveform (30 in FIG. 1) at the generator output port 129.

In a different operation, the level shifter 124 may be used to space the lower extremities of the second straight-line waveform from upper extremities of the first straight-line waveform (22 in FIG. 1) by a separation space (57 in FIG. 1). As described above with respect to FIG. 1, this causes the second curvilinear waveform to be modified to a fifth cuvilinear waveform (58 in FIG. 1) that has reversed peaks (59 in FIG. 1).

Figure 8:
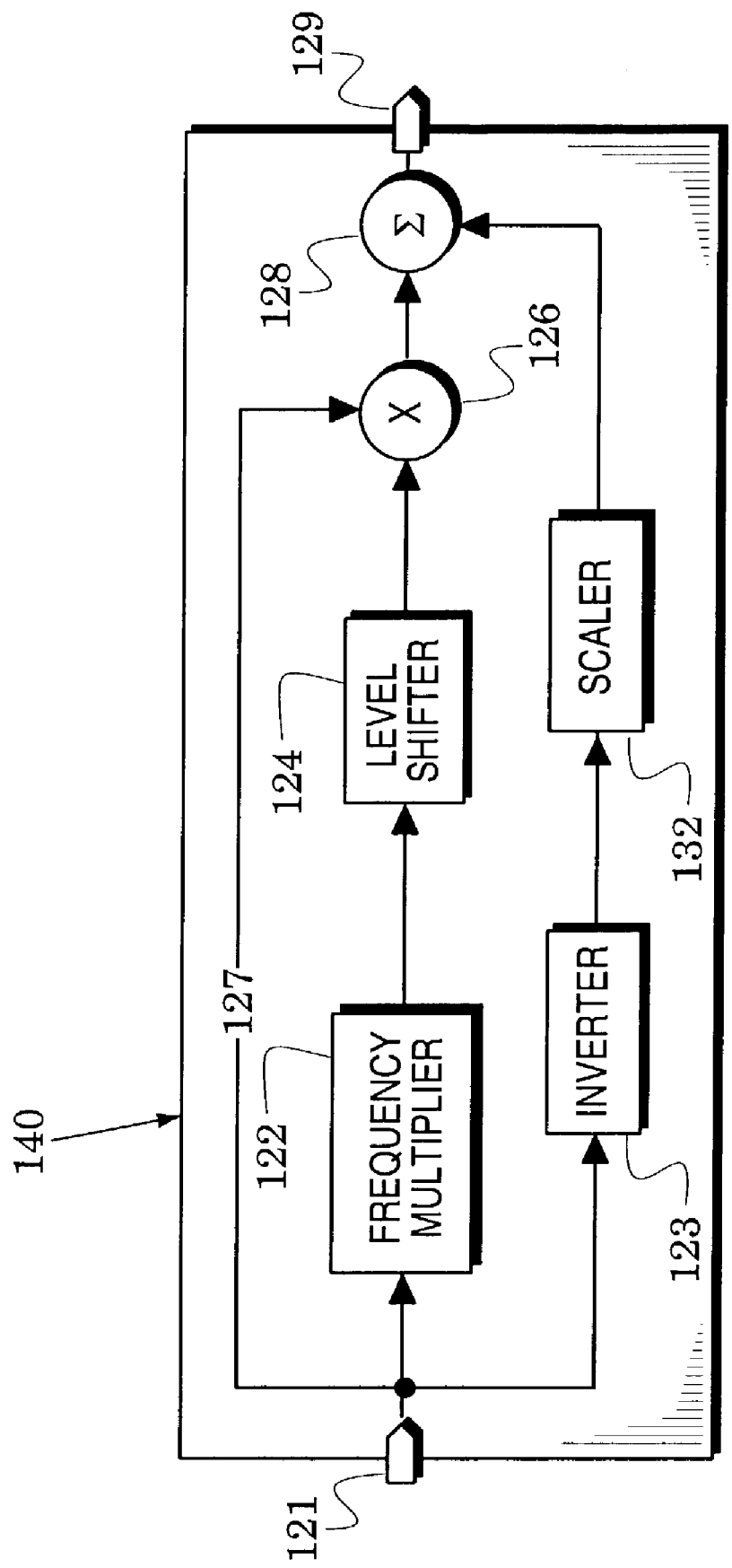

FIG. 8 illustrates a waveform generator 140 that is formed by moving the inverter 123 in FIG. 6 from a serial relationship with the frequency multiplier 122 and level shifter 124 to a serial relationship with the scaler 132.

In an exemplary operation of the waveform generator 140, a first straight-line waveform (22 of FIG. 1) is received at the input port after which it is full-wave rectified by the frequency multiplier 122 and level shifted by the level shifter 124 to form the third straight-line waveform (44 in FIG. 2) whose upper extremities are substantially contiguous with lower extremities of the first straight-line waveform. The first straight-line waveform is also supplied along signal path 127 multiplied by the third straight-line waveform in the multiplier 126 to form the third curvilinear waveform (46 in FIG. 2).

The inverter 123 inverts the first straight-line waveform and the scaler 132 scales the inverted waveform to provide the second scaled straight-line waveform (48 in FIG. 2) which is added to the third curvilinear waveform in the adder 128 to generate the fourth curvilinear waveform (50 in FIG. 2) at the generator output port 129.

The waveform generators 120 and 140 of FIGS. 6 and 8 may be similarly used to generate the asymmetrical curvilinear waveform 86 in FIG. 4. For example, the multiplier 126 and inverter 123 of FIGS. 6 and 7 may be serially-connected so that the multiplier can multiply the fifth and sixth straight-line waveforms (82 and 84 in FIG. 4) to form the asymmetrical curvilinear waveform 86 and the inverter 123 can be clocked to invert the asymmetrical curvilinear waveform 86 in alternate periods to generate the symmetrical curvilinear waveform 88.

Waveform methods have been disclosed which provide curvilinear waveforms that are useful in various electronic systems because they comprise a fundamental sinusoid with an absence of even harmonics and with odd harmonics that are significantly reduced from the fundamental.

Waveform generators have been provided that comprise processors with program storage devices and generators that comprise conventional processing elements (e.g., multipliers, adders, frequency multipliers, level shifters, scalers and inverters) that are commonly formed of analog devices and/or logic gates.

It was previously noted that the generator structures and methods of the invention are generally directed to realizing curvilinear waveforms from straight-line waveforms and that examples of straight-line waveforms are triangle waveforms (e.g., first and second waveforms 22 and 24 in FIG. 1) and sawtooth waveforms (e.g., seventh and eighth waveforms 91 and 95 of FIG. 5).

The embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. A method of generating curvilinear waveforms that each comprise a fundamental sinusoid and harmonics that are substantially reduced from said sinusoid, said method comprising the steps of:
   providing first and second triangle waveforms that respectively comprise first and second straight-line segments; and
   multiplying said first straight-line segments and said second straight-line segments of said first and second triangle waveforms to thereby generate a first curvilinear waveform.

2. The method of claim 1, wherein said first triangle waveform has a first frequency and said second triangle waveform has a second frequency that is substantially an integer multiple of said first frequency.

3. The method of claim 2, wherein said second frequency is substantially one times said first frequency.

4. The method of claim 2, wherein said second frequency is substantially two times said first frequency.

5. The method of claim 2, wherein said second frequency is substantially four times said first frequency.

6. The method of claim 1, wherein said first triangle waveform has a first amplitude and said second triangle waveform has a second amplitude that substantially equals said first amplitude.

7. The method of claim 1, wherein said first triangle waveform has a first amplitude and said second triangle waveform has a second amplitude that is less than said first amplitude.

8. The method of claim 7, wherein said first triangle waveform has a first amplitude and said second triangle waveform has a second amplitude that is substantially one half of said first amplitude.

9. The method of claim 7, wherein said first triangle waveform has a first amplitude and said second triangle waveform has a second amplitude that is substantially one fourth of said first amplitude.

10. The method of claim 1, further including the step of level shifting at least one of said first and second triangle waveforms prior to said multiplying step to position lower extremities of one of said first and second triangle waveforms substantially contiguous with upper extremities of the other of said first and second triangle waveforms.

11. The method of claim 1, wherein said first and second triangle waveforms respectively have first and second amplitudes and further including the step of level shifting at least one of said first and second triangle waveforms prior to said multiplying step to space lower extremities of one of said first and second triangle waveforms from upper extremities of the other of said first and second triangle waveforms by a separation space that is less than one half of the least of said first and second amplitudes.

12. The method of claim 1, wherein said providing step includes the step of full-wave rectifying one of said first and second triangle waveforms to thereby generate the other of said first and second triangle waveforms.

13. The method of claim 1, wherein said providing step includes the step of frequency multiplying one of said first and second triangle waveforms to thereby generate the other of said first and second triangle waveforms.

14. The method of claim 1, wherein said providing step includes the step of frequency dividing one of said first and second triangle waveforms to thereby generate the other of said first and second triangle waveforms.

15. The method of claim 1, wherein said first curvilinear waveform defines an asymmetrical waveform in each of successive periods and further including the step of inverting said asymmetrical waveform in alternate periods to thereby generate a symmetrical curvilinear waveform.

16. The method of claim 1, further including the step of adding a third triangle waveform to said first curvilinear waveform to thereby generate a second curvilinear waveform.

17. The method of claim 16, further including the step of scaling one of said first and second triangle waveforms to provide said third triangle waveform.

18. The method of claim 16, wherein:
   said first triangle waveform has a first frequency and said second triangle waveform has a second frequency that is substantially two times said first frequency; and
   said first triangle waveform has a first amplitude and said second triangle waveform has a second amplitude less than said first amplitude;
   and further including the step of level shifting at least one of said first and second triangle waveforms prior to said multiplying step to position lower extremities of one of said first and second triangle waveforms substantially contiguous with upper extremities of the other of said first and second triangle waveforms.

19. The method of claim 1, further including the steps of:
providing a third triangle waveform that respectively comprises third straight-line segments;
multiplying said third straight-line segments and the straight-line segments of one of said first and second triangle waveforms to generate a second curvilinear waveform; and
adding said first and second curvilinear waveforms to thereby generate a third curvilinear waveform.

20. The method of claim 19, wherein said adding step is preceded by the step of reducing the amplitude of one of said first and second curvilinear waveforms.

21. The method of claim 19, wherein said first waveform has a first frequency and said second and third triangle waveforms respectively have second and third frequencies that are integer multiples of said first frequency.

22. A program storage device having instructions, readable and executable by a processor, that define a method for generating curvilinear waveforms which each comprise a fundamental sinusoid and harmonics that are substantially reduced from said sinusoid, said method comprising the steps of:
providing first and second triangle waveforms that respectively comprise first and second straight-line segments; and
multiplying said first straight-line segments and said second straight-line segments of said first and second triangle waveforms to thereby generate a first curvilinear waveform.

23. The device of claim 22, wherein said first triangle waveform has a first frequency and said second triangle waveform has a second frequency that is substantially an integer multiple of said first frequency.

24. The device of claim 22, wherein said first triangle waveform has a first amplitude and said second triangle waveform has a second amplitude that substantially equals said first amplitude.

25. The device of claim 22, wherein said first triangle waveform has a first amplitude and said second triangle waveform has a second amplitude that is less than said first amplitude.

26. The device of claim 22, wherein said method further includes the step of level shifting at least one of said first and second triangle waveforms prior to said multiplying step to position lower extremities of one of said first and second triangle waveforms substantially contiguous with upper extremities of the other of said first and second triangle waveforms.

27. The device of claim 22 wherein:
said first and second triangle waveforms respectively have first and second amplitudes; and
said method further includes the step of level shifting at least one of said first and second triangle waveforms prior to said multiplying step to space lower extremities of one of said first and second triangle waveforms from upper extremities of the other of said first and second triangle waveforms by a separation space that is less than one half of the least of said first and second amplitudes.

28. The device of claim 22, wherein said providing step includes the step of full-wave rectifying one of said first and second triangle waveforms to thereby generate the other of said first and second triangle waveforms.

29. The device of claim 22, wherein said providing step includes the step of frequency multiplying one of said first and second triangle waveforms to thereby generate the other of said first and second triangle waveforms.

30. The device of claim 22, wherein said providing step includes the step of frequency dividing one of said first and second triangle waveforms to thereby generate the other of said first and second triangle waveforms.

31. The device of claim 22, wherein said first curvilinear waveform defines an asymmetrical waveform in each of successive periods and said method further includes the step of inverting said asymmetrical waveform in alternate periods to thereby generate a symmetrical curvilinear waveform.

32. The device of claim 22, wherein said method further includes the step of adding a third triangle waveform to said first curvilinear waveform to thereby generate a second curvilinear waveform.

33. The device of claim 32, wherein said method further includes the step of scaling one of said first and second triangle waveforms to provide said third waveform.

34. The device of claim 22, wherein said method further includes the steps of:
providing a third triangle waveform that respectively comprises third straight-line segments;
multiplying said third straight-line segments and the straight-line segments of one of said first and second triangle waveforms to generate a second curvilinear waveform; and
adding said first and second curvilinear waveforms to thereby generate a third curvilinear waveform.

35. The device of claim 34, wherein said adding step is preceded by the step of reducing the amplitude of one of said first and second curvilinear waveforms.

36. A waveform generator that generates curvilinear waveforms which each comprise a fundamental sinusoid and harmonics that are substantially reduced from said sinusoid, said system comprising:
a multiplier that multiplies first straight-line segments of a first triangle waveform and second straight-line segments of a second triangle waveform to thereby generate a first curvilinear waveform.

37. The generator of claim 36, further including a frequency multiplier that precedes said multiplier to multiply one of said first and second triangle waveforms to a frequency that is an integer multiple of the frequency of the other of said first and second triangle waveforms.

38. The generator of claim 37, wherein said integer multiple is selected from two and four.

39. The generator of claim 37, wherein said frequency multiplier is a full-wave rectifier.

40. The generator of claim 36, further including a frequency divider that precedes said multiplier to divide one of said first and second triangle waveforms to a divided frequency wherein the frequency of the other of said first and second triangle waveforms is an integer multiple of said divided frequency.

41. The generator of claim 36, further including a scaler that precedes said multiplier to scale one of said first and second triangle waveforms to an amplitude that differs from the amplitude of the other of said first and second triangle waveforms.

42. The generator of claim 41, wherein one of said first and second triangle waveforms has a first amplitude and the other of said first and second triangle waveforms has a second amplitude that is substantially one half of said first amplitude.

43. The generator of claim 41, wherein one of said first and second triangle waveforms has a first amplitude and the other of said first and second triangle waveforms has a second amplitude that is substantially one fourth of said first amplitude.

44. The generator of claim 36, further including a level shifter that precedes said multiplier to shift the level of one of said first and second triangle waveforms.

45. The generator of claim 36, further including an inverter that precedes said multiplier to invert one of said first and second triangle waveforms.

46. The generator of claim 36, further including an adder arranged in association with said multiplier to add at least a scaled portion of one of said first and second triangle waveforms to said first curvilinear waveform to thereby generate a second curvilinear waveform.

* * * * *